(12) United States Patent
Lv et al.

(10) Patent No.: US 12,242,121 B2
(45) Date of Patent: Mar. 4, 2025

(54) HEAT DISSIPATION STRUCTURE FOR OPTOELECTRONIC MODULE AND ELECTRONIC DEVICE

(71) Applicant: Ruijie Networks Co., Ltd., Fuzhou (CN)

(72) Inventors: Xiaolong Lv, Fujian (CN); Wei Liu, Fujian (CN); Guohong Lai, Fujian (CN)

(73) Assignee: Ruijie Networks Co., Ltd., Fuzhou (CN)

( * ) Notice: Subject to any disclaimer, the term of this patent is extended or adjusted under 35 U.S.C. 154(b) by 0 days.

(21) Appl. No.: 18/734,054

(22) Filed: Jun. 5, 2024

(65) Prior Publication Data

US 2024/0319456 A1    Sep. 26, 2024

Related U.S. Application Data

(63) Continuation of application No. PCT/CN2023/116294, filed on Aug. 31, 2023.

(30) Foreign Application Priority Data

Aug. 31, 2022    (CN) .......................... 202211052270.8

(51) Int. Cl.
G02B 6/42    (2006.01)
H05K 7/20    (2006.01)

(52) U.S. Cl.
CPC ....... G02B 6/4268 (2013.01); H05K 7/20336 (2013.01); H05K 7/20509 (2013.01)

(58) Field of Classification Search
CPC ........... H05K 7/20336; H05K 7/20509; G02B 6/4266–4273
See application file for complete search history.

(56) References Cited

U.S. PATENT DOCUMENTS 10,779,439 B2 *   9/2020  Chen ................. H05K 7/20336
11,477,904 B2 * 10/2022  Blackburn ........... H05K 7/1069
(Continued)

FOREIGN PATENT DOCUMENTS

CN    101420838 A    4/2009
CN    202306432 U    7/2012
(Continued)

OTHER PUBLICATIONS

International Search Report received for PCT Patent Application No. PCT/CN2023/116294, mailed on Nov. 19, 2023, 5 pages (3 pages of English Translation and 2 pages of Original Document).

*Primary Examiner* — Zachary Pape
(74) *Attorney, Agent, or Firm* — ArentFox Schiff LLP; Michael Fainberg

(57) ABSTRACT

This application discloses a heat dissipation structure for an optoelectronic module and an electronic device. The heat dissipation structure includes: an electronic chip; a plurality of optical engines, the plurality of optical engines being distributed along a periphery of the electronic chip; and a cold plate. The cold plate includes: a main cold plate for dissipating heat for the electronic chip; a secondary cold plate for dissipating heat for at least one of the plurality of optical engines; and a heat pipe assembly corresponding to the secondary cold plate. The heat pipe assembly includes at least one heat pipe, which has an evaporating end connected to the secondary cold plate and a condensing end connected to the main cold plate. The main cold plate is equipped with a flow channel for dissipating heat for the heat pipe assembly, and the secondary cold plate has a maintenance operation position.

14 Claims, 6 Drawing Sheets

(56) References Cited

U.S. PATENT DOCUMENTS

| | | | |
|---|---|---|---|
| 11,943,886 B2* | 3/2024 | Blackburn | H01R 13/24 |
| 2007/0091570 A1 | 4/2007 | Campbell et al. | |
| 2010/0000720 A1* | 1/2010 | Li | H01L 23/427 |
| | | | 165/104.33 |
| 2024/0244800 A1* | 7/2024 | Subrahmanyam | ............................ |
| | | | H05K 7/20336 |

FOREIGN PATENT DOCUMENTS

| | | |
|---|---|---|
| CN | 206657307 U | 11/2017 |
| CN | 107920458 A | 4/2018 |
| CN | 114615866 A | 6/2022 |

* cited by examiner

HEAT DISSIPATION STRUCTURE FOR OPTOELECTRONIC MODULE AND ELECTRONIC DEVICE

CROSS-REFERENCE TO RELATED APPLICATIONS

This application is a continuation of International Patent Application No. PCT/CN2023/116294 filed on Aug. 31, 2023, which claims priority to Chinese patent application No. 202211052270.8, filed with the China National Intellectual Property Administration on Aug. 31, 2022, and entitled "HEAT DISSIPATION STRUCTURE FOR OPTOELECTRONIC MODULE AND ELECTRONIC DEVICE", both of which are incorporated herein by reference in their entireties.

TECHNICAL FIELD

This application relates to the technical field of optoelectronic modules and particularly to a heat dissipation structure for an optoelectronic module, and an electronic device.

BACKGROUND

Under the strong pull of technologies such as High Performance Computing (HPC) and Artificial Intelligence (AI) exerted on the demand for exchange bandwidth in data centers, optical components of electronic devices are rapidly evolving along the technological routes of Co-packaged Optics (CPO) and Near-packaged Optics (NPO). This has led to significant changes in the thermal source distribution of optoelectronic modules within electronic devices. Taking an optoelectronic module that includes an ASIC chip and 16 Optical Engines (OEs) closely surrounding the ASIC chip as an example, the total heat dissipation power of the optoelectronic module is as high as 1100-1850 W. Thus, the heat dissipation for the optoelectronic module has become a challenge and hinders the practical application of CPO/NPO technology.

SUMMARY

The exemplary embodiments of this application provide a heat dissipation structure for an optoelectronic module and an electronic device, which can improve the cumbersome process of optical module replacement in replacing an optoelectronic module that requires removing the entire cold plate.

A first aspect of this application provides a heat dissipation structure for an optoelectronic module, including:
  an electronic chip;
  a plurality of optical engines, the plurality of optical engines being distributed along a periphery of the electronic chip; and
  a cold plate, the cold plate including:
  a main cold plate for dissipating heat for the electronic chip;
  a secondary cold plate for dissipating heat for at least one of the plurality of optical engines; and
  a heat pipe assembly corresponding to the secondary cold plate, the heat pipe assembly including at least one heat pipe, where the at least one heat pipe has an evaporating end connected to the secondary cold plate and a condensing end connected to the main cold plate;
  where the main cold plate is provided with a flow channel for dissipating heat for the heat pipe assembly, and the secondary cold plate has a maintenance operation position, where when the secondary cold plate is in the maintenance operation position, there is an operational space between the secondary cold plate and the corresponding optical engine for maintaining the corresponding optical engine.

In the heat dissipation structure for an optoelectronic module provided by the exemplary embodiments of this application, the main cold plate dissipates heat for the electronic chip, the evaporating end of the heat pipe assembly takes away the heat from the secondary cold plate, and the main cold plate cools the condensing end of the heat pipe assembly, thereby dissipating heat for each optical engine. The secondary cold plate has a maintenance operation position, and when the secondary cold plate is in the maintenance operation position, there is an operational space between the secondary cold plate and the corresponding optical engine for maintaining the optical engine. Consequently, for maintenance tasks on the optical engines (such as repairs or replacements), there is no need to remove the entire cold plate system; instead, simply positioning the secondary cold plate in the maintenance operation position suffices. Compared with traditional technology, the heat dissipation structure for an optoelectronic module provided by the exemplary embodiments of this application makes the replacement and maintenance of the optical engines more convenient and quicker.

Furthermore, in the heat dissipation structure for an optoelectronic module provided by this application, no liquid pipeline or connector is introduced for the connection between the main cold plate and the secondary cold plate. Thus, there is no risk of coolant leakage on the connection between the main cold plate and the secondary cold plate, which is more conducive to the safe operation of the electronic device provided with this heat dissipation structure.

Optionally, the electronic chip is of a polygonal structure, the at least one heat pipe includes two first heat pipes spaced apart along a length direction of a corresponding edge of the electronic chip, and the two first heat pipes each include an evaporating end rotatably arranged on the corresponding secondary cold plate, a condensing end rotatably arranged on the main cold plate, and a connecting section connecting the evaporating end and the condensing end; and
  the two first heat pipes together with the main cold plate and the secondary cold plate constitute a double crank mechanism, and a connecting line between the two condensing ends of the two first heat pipes on the main cold plate is a frame of the double crank mechanism, allowing the secondary cold plate to switch from an installation operation position to the maintenance operation position.

Optionally, the double crank mechanism is an unequal-length double crank mechanism or an equal-length double crank mechanism.

Optionally, the at least one heat pipe further includes a virtual constraint heat pipe, the virtual constraint heat pipe including an evaporating end arranged on the secondary cold plate, a condensing end arranged on the main cold plate, and a connecting section connecting the evaporating end and the condensing end, and the virtual constraint heat pipe forms a virtual constraint between the main cold plate and the secondary cold plate.

Optionally, the electronic chip is of a polygonal structure, the at least one heat pipe includes a second heat pipe arranged at one side of a corresponding edge of the electronic chip, the second heat pipe includes a first part rotationally arranged on the main cold plate and a second part connected to the first part and away from the main cold plate, and the second part is fixedly connected to the secondary cold plate.

Optionally, a length direction of the secondary cold plate is parallel to a length direction of the corresponding edge of the electronic chip; and the first part and the second part form an angle with each other, and the first part and the secondary cold plate are sequentially arranged along the length direction of the secondary cold plate.

Optionally, the electronic chip is of a polygonal structure, the at least one heat pipe includes at least one third heat pipe arranged at one side of a corresponding edge of the electronic chip, the third heat pipe includes a third part detachably connected to the main cold plate and a fourth part connected to the third part and away from the main cold plate, and the fourth part is fixedly connected to the secondary cold plate.

Optionally, the electronic chip is of a polygonal structure, the at least one heat pipe includes at least one fourth heat pipe arranged at one side of a corresponding edge of the electronic chip, and the fourth heat pipe includes a fifth part detachably connected to the main cold plate and a sixth part connected to the fifth part and away from the main cold plate, the sixth part being fixedly connected to the corresponding secondary cold plate.

Optionally, the plurality of optical engines are divided into a plurality of optical engine groups, and the plurality of optical engine groups respectively correspond to different edges of the electronic chip, where each of the optical engine groups includes a plurality of optical engines arranged along a length direction of the corresponding edge of the electronic chip, and the secondary cold plate corresponds to one of the plurality of optical engine groups.

Optionally, the main cold plate is provided with a first limiting insertion hole corresponding to the condensing end of the at least one heat pipe, the condensing end is inserted into the first limiting insertion hole, and an inner wall of the first limiting insertion hole or an outer peripheral surface of the at least one heat pipe is provided with a first thermally conductive layer.

And/or, the secondary cold plate is provided with a second limiting insertion hole corresponding to the evaporating end of the at least one heat pipe, the evaporating end of the at least one heat pipe is inserted into the corresponding second limiting insertion hole, and an inner wall of the second limiting insertion hole or an outer peripheral surface of each of the at least one heat pipe is provided with a second thermally conductive layer.

Optionally, the flow channel is arranged around a periphery of the heat pipe assembly to achieve heat dissipation for the electronic chip and the heat pipe assembly.

Optionally, the main cold plate is a rectangular cold plate, the heat pipes are all connected to a periphery of the rectangular cold plate, and the central part of the rectangular cold plate is provided with a radiator.

Optionally, the main cold plate is provided with a coolant inlet and a coolant outlet, and one end of the flow channel communicates with the coolant inlet and another end of the flow channel communicates with the coolant outlet.

Optionally, the coolant inlet communicates with the flow channel through a liquid distribution structure, and the coolant outlet communicates with the flow channel through a liquid collection structure.

Optionally, the main cold plate is a rectangular cold plate, the at least one heat pipe is connected to the periphery of the rectangular cold plate, and the rectangular cold plate is provided with a radiator.

Optionally, the at least one heat pipe is arranged on the main cold plate and is located in the peripheral area of the radiator.

Another aspect of this application provides an electronic device, including any of the heat dissipation structures for an optoelectronic module provided in the above technical solutions.

In the heat dissipation structure for an optoelectronic module provided by the exemplary embodiments of this application, the main cold plate dissipates heat for the electronic chip, the evaporating end of the heat pipe assembly takes away the heat from the secondary cold plate, and the main cold plate cools the condensing end of the heat pipe assembly, thereby dissipating heat for each optical engine. The secondary cold plate has a maintenance operation position, and when the secondary cold plate is in the maintenance operation position, there is an operational space between the secondary cold plate and the corresponding optical engine for maintaining the optical engine. Consequently, for maintenance tasks on the optical engines (such as repairs or replacements), there is no need to remove the entire cold plate system; instead, simply positioning the secondary cold plate in the maintenance operation position suffices. Compared with traditional technology, the heat dissipation structure for an optoelectronic module provided by the exemplary embodiments of this application makes the replacement and maintenance of the optical engines more convenient and quicker.

Furthermore, in the heat dissipation structure for an optoelectronic module, the connection between the main cold plate and the secondary cold plate does not introduce liquid pipelines or connectors. Thus, there is no risk of coolant leakage on the connection between the main cold plate and the secondary cold plate, which is more conducive to the safe operation of the electronic device equipped with this heat dissipation structure.

Other features and advantages of this application will be set forth in the following specification, and in part will be readily apparent from the specification, or may be understood by implementing this application. Objectives and other advantages of this application may be implemented and obtained via the structures particularly specified in the described specification, claims, and accompanying drawings.

BRIEF DESCRIPTION OF DRAWINGS

To describe the technical solutions in the embodiments of this application more clearly, the following briefly describes the accompanying drawings for describing the embodiments. Clearly, the accompanying drawings in the following descriptions show merely some embodiments of this application, and persons of ordinary skill in the art may still derive other drawings from these accompanying drawings without creative efforts.

REFERENCE NUMERALS

Figure 1:
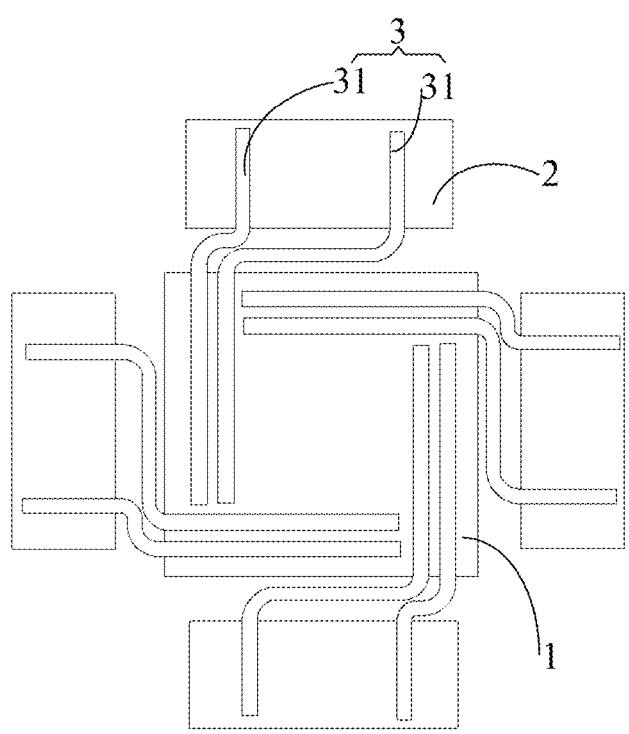
FIG. 1 is a schematic diagram of a heat dissipation structure for an optoelectronic module provided by an embodiment of this application.

1—main cold plate; 2—secondary cold plate; 3—heat pipe assembly; 31—first heat pipe; 32—virtual constraint heat pipe; 33—second heat pipe; 34—third heat pipe; 35—fourth heat pipe; 41—first thermally conductive layer; 42—second thermally conductive layer; 5—radiator; 6—flow channel; 7—coolant inlet; 8—coolant outlet; 91—liquid distribution structure; and 92—liquid collection structure.

S-frame; L-frame connecting rod; P-frame connecting rod; Q-connecting rod; 36-evaporating end; 37-condensing end; 331-first part of the second heat pipe; 332-second part of the second heat pipe; a-angle formed with the first part and the second part of the second heat pipe; 341-third part of the third heat pipe; 342-fourth part of the third heat pipe; 351-fifth part of the fourth heat pipe; and 352-sixth part of the fourth heat pipe.

DESCRIPTION OF EMBODIMENTS

To enable persons skilled in the art to better understand the solution proposed by this application, the following clearly and thoroughly describes the technical solutions in the embodiments of this application with reference to the accompanying drawings in the embodiments of this application. Apparently, the described embodiments are merely some but not all of the embodiments of this application. All other embodiments obtained by a person of ordinary skill in the art based on the embodiments of this application without creative efforts shall fall within the protection scope of this application.

It should be noted that, in the specification, claims, and accompanying drawings of this application, the terms "first", "second", and the like are intended to distinguish between similar objects but do not necessarily indicate a specific sequence or order. It should be understood that data used in this way is interchangeable where appropriate so that the embodiments of this application described herein may be implemented in orders other than the order illustrated or described herein. Furthermore, the terms "include" and "have", as well as any variations thereof, are intended to cover non-exclusive inclusions. For example, a process, method, system, product, or device that includes a series of steps or units is not necessarily limited to those steps or units clearly listed but may include other steps or units not clearly listed or inherent to such process, method, product, or device.

In the traditional technology, cold plate liquid cooling technology is used to dissipate heat for optoelectronic modules. In practical applications, OEs often need to be replaced. However, when using traditional cold plate liquid cooling technology, replacing an optical engine requires removing the entire cold plate, making the process of replacing the optical engine quite cumbersome.

The heat dissipation structure for an optoelectronic module provided by this embodiment includes an electronic chip (for example, an ASIC chip) and a plurality of OEs distributed along a periphery of the electronic chip, as well as a cold plate. The cold plate includes a main cold plate 1 for dissipating heat for the electronic chip, a secondary cold plate 2 for dissipating heat for the OEs, and a heat pipe assembly 3 corresponding one-to-one with the secondary cold plate 2, where the heat pipe assembly 3 has an evaporating end connected to the secondary cold plate 2, and a condensing end connected to the main cold plate 1. The main cold plate 1 is provided with a flow channel 6 for dissipating heat for each heat pipe assembly 3.

The secondary cold plate 2 has a maintenance operation position, and when the secondary cold plate 2 is in the maintenance operation position, there is an operational space between the secondary cold plate 2 and the corresponding OE for maintaining the OE.

In the heat dissipation structure for an optoelectronic module provided by this embodiment, the main cold plate 1 dissipates heat for the electronic chip, and then the heat from the secondary cold plate 2 is taken away by the evaporating end of the heat pipe. The main cold plate 1 cools the condensing end of the heat pipe, thereby dissipating heat for each OE. The secondary cold plate 2 has a maintenance operation position, and when the secondary cold plate 2 is in the maintenance operation position, there is an operational space between the secondary cold plate 2 and the corresponding OE for maintaining the OE. Consequently, for maintenance tasks on the OEs (such as repairs or replacements), there is no need to remove the entire cold plate system; instead, simply positioning the secondary cold plate 2 in the maintenance operation position suffices, making the replacement and maintenance of the OEs more convenient and quicker compared to traditional technology.

Furthermore, in the heat dissipation structure for an optoelectronic module provided by this embodiment, the connection between the main cold plate 1 and the secondary cold plate 2 does not introduce liquid pipelines or connectors. Thus, there is no risk of coolant leakage on the connection between the main cold plate 1 and the secondary cold plate 2, which is more conducive to the safe operation of the electronic device equipped with this heat dissipation structure.

The secondary cold plate 2 mentioned in this embodiment may be a metal plate with good thermal conductivity, such as a copper plate or an aluminum plate. The main cold plate 1 may be fixed to the related structure with screws, and those skilled in the art will recognize that it is not necessary to detach the main cold plate 1 when maintaining the OEs.

Figure 2:
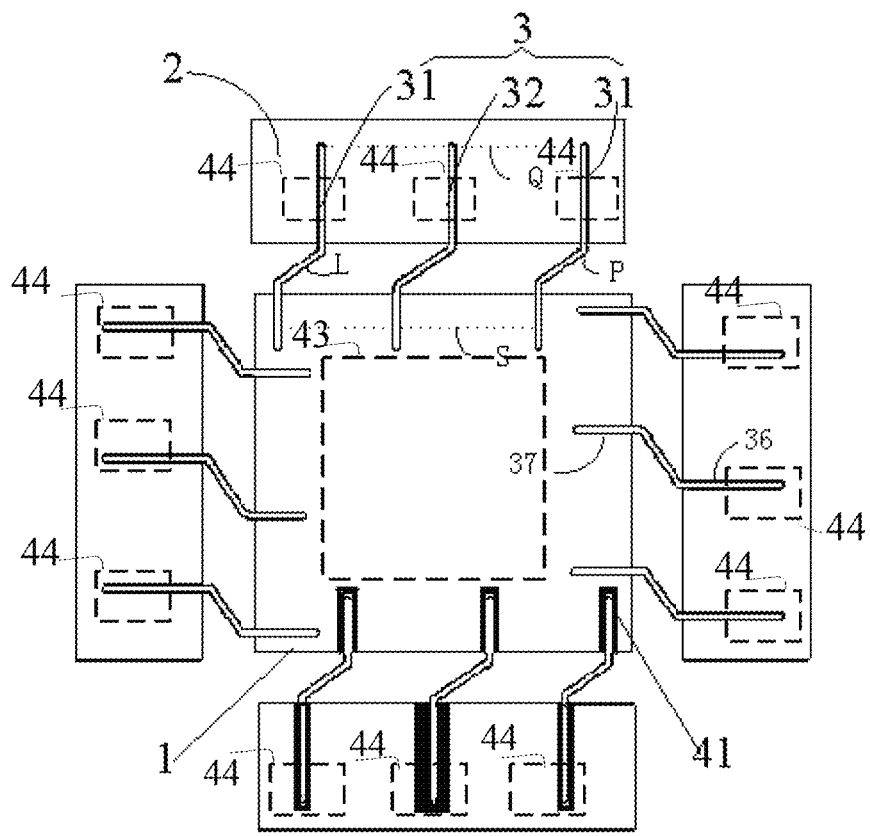
FIG. 2 is a schematic diagram of another heat dissipation structure for an optoelectronic module provided by an embodiment of this application.
Figure 3:
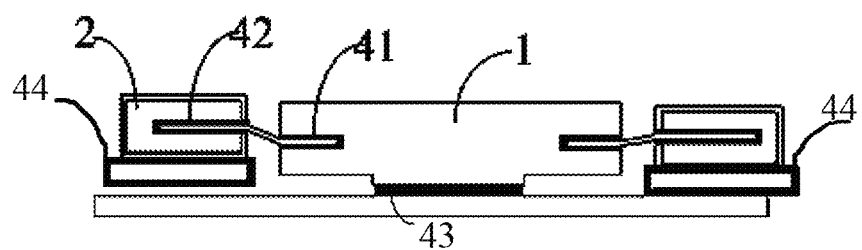
FIG. 3 is a side view of the heat dissipation structure for an optoelectronic module shown in FIG. 2.
Figure 7:
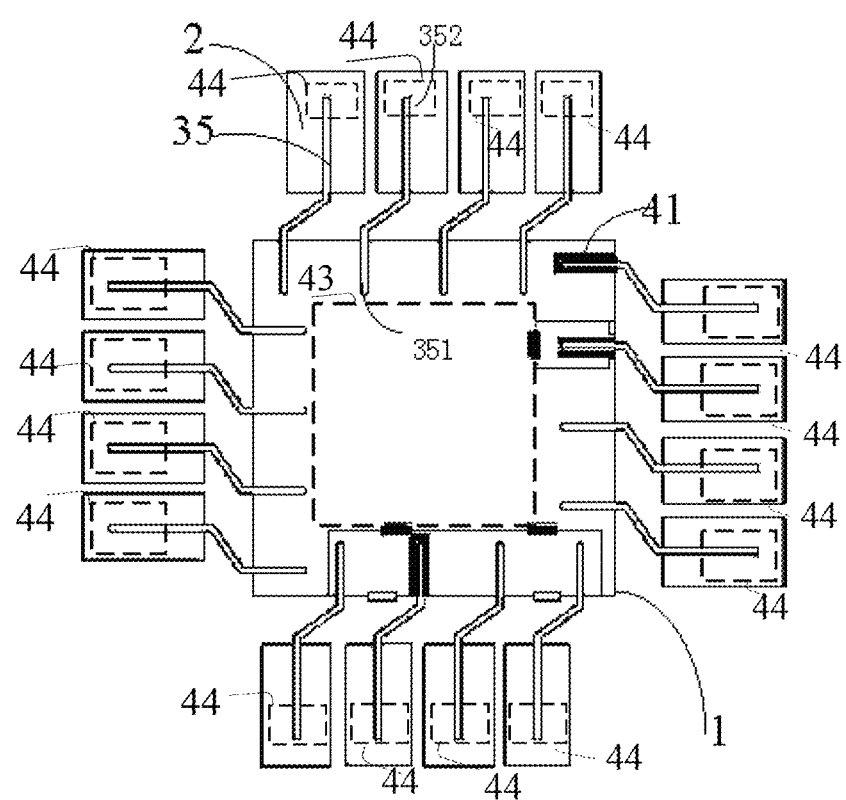
FIG. 7 is a schematic diagram of yet another heat dissipation structure for an optoelectronic module provided by an embodiment of this application.

The electronic chip is generally of a polygonal structure. In an optional implementation, the plurality of OEs are divided into a plurality of OE groups, and different OE groups correspond to different edges of the electronic chip, where each OE group includes a plurality of OEs arranged along a length direction of the corresponding edge of the electronic chip. As shown in FIGS. 1 to 3, the secondary cold plates 2 correspond one-to-one with the OE groups. As shown in FIG. 2, the secondary cold plate 2 is shown above the corresponding OEs 44 (shown in dashed lines). The OEs in a group share a cold plate 2. The main cold plate 1 is shown above the electronic chip 43 (shown in dashed lines). In one aspect, the electronic chip 43 has polygonal structure. FIG. 3 is a side view of the heat dissipation structure for an optoelectronic module shown in FIG. 2. It is noted that the number of OEs in a given group may vary. For example, groups with 4 QEs are shown in FIG. 7.

The heat pipe assembly 3 includes two first heat pipes 31 spaced apart along a length direction of a corresponding edge of the electronic chip, and the first heat pipes 31 each include an evaporating end rotatably arranged on the secondary cold plate 2, that is, the evaporating end is rotatably connected to the secondary cold plate 2, a condensing end rotatably arranged on the main cold plate 1, that is, the condensing end is rotatably connected to the main cold plate 1, and a connecting section connecting the evaporating end and the condensing end.

Figure 4:
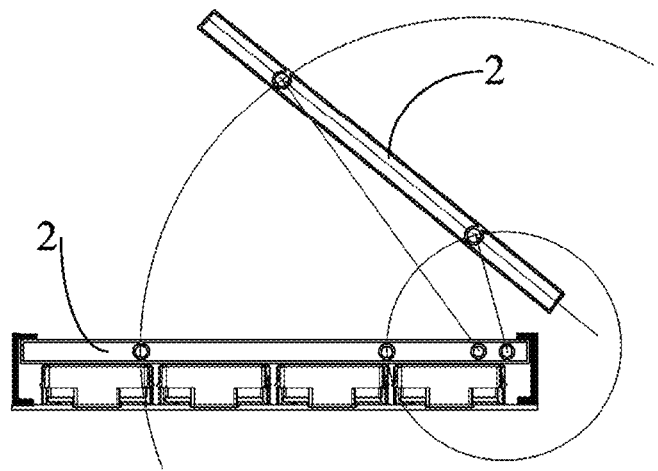
FIG. 4 is a state diagram of a secondary cold plate in the heat dissipation structure for an optoelectronic module shown in FIG. 1, showing the secondary cold plate at an installation operation position and a maintenance operation position.

In an embodiment, the two first heat pipes 31 together with the main cold plate 1 and the secondary cold plate 2 constitute a double crank mechanism, and a connecting line between the two condensing ends of the two first heat pipes 31 on the main cold plate 1 is a frame of the double crank mechanism. Thus, when it is necessary to repair or replace one or more OEs in a certain OE group, after detaching the connection between the secondary cold plate 2 and a structure used to fix the secondary cold plate 2 (for example, a fastener), the corresponding secondary cold plate 2 is pivoted, that is, allowing the secondary cold plate 2 to switch from an installation operation position to the maintenance operation position, in a direction away from the corresponding OE, thereby exposing the corresponding OE for repair or replacement. Taking FIG. 4 as an example, the secondary cold plate 2 in a horizontal state is at the installation operation position, and the secondary cold plate 2 above is switched to the maintenance position after pivoting.

Additionally, the two first heat pipes 31 together with the main cold plate 1 and the secondary cold plate 2 may constitute a double crank mechanism. The parts of the two first heat pipes 31, that is, the connecting sections, located between the main cold plate 1 and the corresponding secondary cold plate 2 are utilized for compensating for the height difference between the main cold plate 1 and the secondary cold plate 2, making the installation of the heat dissipation structure for an optoelectronic module provided by this embodiment easier.

In one heat pipe assembly 3, the two first heat pipes 31 together with the main cold plate 1 and the corresponding secondary cold plate 2 constitute a double crank mechanism, and a connecting line between the two condensing ends of the two first heat pipes 31 on the main cold plate 1 is a frame of the double crank mechanism. Specifically, the parts of the two first heat pipes 31 of the same heat pipe 3, located between the main cold plate 1 and the corresponding secondary cold plate 2 are frame connecting rods (that is, the connecting sections), and the line connecting the evaporating ends of the two first heat pipes 31 is a connecting rod. For ease of description, the frame is denoted as S, the longer one of the two frame connecting rods is denoted as L, the shorter one as P, and the connecting rod as Q. The above-mentioned double crank mechanism satisfies $S+L=P+Q$, thereby achieving the pivoting ability of the secondary cold plate 2. When it is necessary to maintain or replace a certain OE, the fastener on the corresponding secondary cold plate 2 may be released, and then the secondary cold plate 2 may be moved upwards and pivoted at a certain angle, thereby easily obtaining the operational space for maintenance or replacement of the OE.

Exemplarily, the above-mentioned double crank mechanism may be an unequal-length double crank mechanism or an equal-length double crank mechanism. The connecting sections of the heat pipes in each heat pipe assembly 3 may be straight or all bent.

The casings of the heat pipes may be made of metal material. The heat pipe may have a three-segment structure with two bends, where the bending angle range of the two bends may be from 90° to 135°. Due to the inherent ductility and elasticity of metal, it can better eliminate the adverse effects on fitting and heat dissipation, such as differences in height between the cold plate and the heat source plane, roughness, and thermal stress caused by processing errors, actual assembly tolerances, and thermal expansion and contraction.

If there is still not enough space, the secondary cold plate 2 along with the heat pipes inserted into the main cold plate 1 may be pulled out from the main cold plate. After the OE replacement is completed, the heat pipes may be reinserted into the main cold plate, and the secondary cold plate 2 may be rotated back to be at a horizontal angle with and abut on the OE, and fastened with a fastener.

Exemplarily, the secondary cold plate 2 may be fixed to the related structure with a fastener.

Referring to FIG. 2 for further details, for specific arrangement of the above-mentioned heat pipe assembly 3, in an optional implementation, the heat pipe assembly 3 also includes a virtual constraint heat pipe 32, where the virtual constraint heat pipe 32 includes an evaporating end arranged on the corresponding secondary cold plate 2, a condensing end arranged on the main cold plate 1, and a connecting section connecting the evaporating end and the condensing end. The virtual constraint heat pipe 32 forms a virtual constraint between the main cold plate 1 and the corresponding secondary cold plate 2.

The virtual constraint heat pipe 32 forms a virtual constraint between the main cold plate 1 and the corresponding secondary cold plate 2, that is, the constraint formed by the virtual constraint heat pipe 32 between the main cold plate 1 and the corresponding secondary cold plate 2 is redundant with the constraints of another kinematic pair (such as the above-mentioned double crank mechanism), and the virtual constraint heat pipe 32 does not actually play a role in constraining the movement of the mechanism.

Exemplarily, in an optional implementation, the connecting section of the virtual constraint heat pipe 32 may be in a corrugated tube-shape, so that the virtual constraint heat pipe 32 forms a virtual constraint between the main cold plate 1 and the corresponding secondary cold plate 2. In another optional implementation, the hole in the secondary cold plate 2 for connecting with the corresponding virtual constraint heat pipe 32 is an elongated oval hole, so that the virtual constraint heat pipe 32 forms a virtual constraint between the main cold plate 1 and the corresponding secondary cold plate 2.

Figure 5:
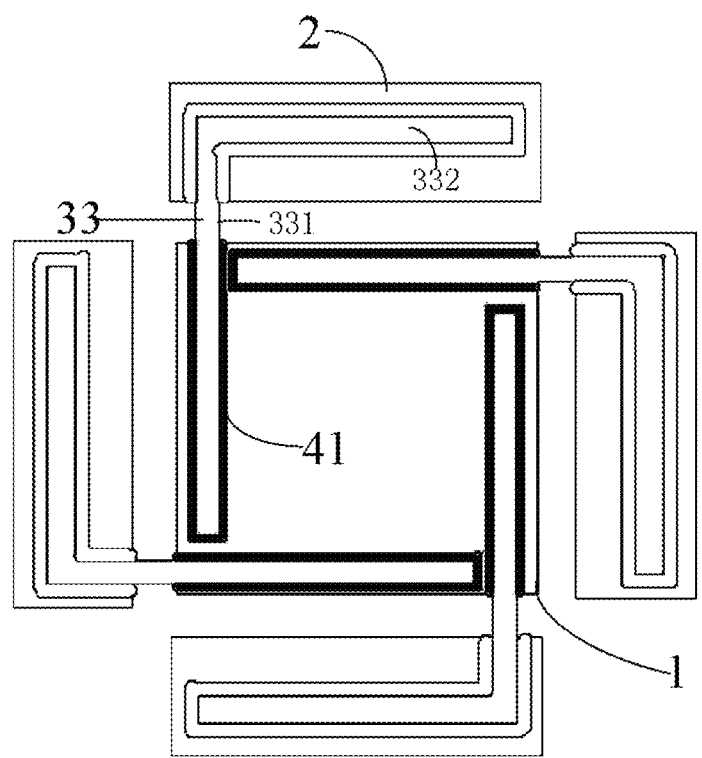
FIG. 5 is a schematic diagram of another heat dissipation structure for an optoelectronic module provided by an embodiment of this application.

Still considering an example with the electronic chip being a polygonal structure, where a plurality of OEs are divided into a plurality of OE groups, different OE groups correspond to different edges of the electronic chip, and each OE group includes a plurality of OEs arranged along a length direction of the corresponding edge of the electronic chip, in an optional implementation, as shown in FIG. 5, the secondary cold plates 2 correspond one-to-one with the OE groups, and the heat pipe assembly 3 includes a second heat pipe 33. The second heat pipe 33 includes a first part 331 rotationally arranged at one end of the main cold plate 1 and a second part 332 connected to the first part and away from the main cold plate 1, the second part 332 being fixedly connected (for example, by brazing) to the corresponding secondary cold plate 2.

In this case, the first part forms the pivot axis of the corresponding secondary cold plate 2, and when it is necessary to repair or replace one or more OEs in a certain OE group, the corresponding secondary cold plate 2 is pivoted in a direction away from the corresponding OE (that is, allowing the secondary cold plate 2 to switch from an installation operation position to the maintenance operation position), thereby exposing the corresponding OE.

Further, in an optional implementation, a length direction of the secondary cold plate 2 is parallel to a length direction of the corresponding edge of the electronic chip, the first part and the corresponding second part form an angle $\alpha$, and the first part serving as the pivot axis and the corresponding secondary cold plate 2 are sequentially arranged along the length direction of the secondary cold plate 2. That is, the first part serving as the pivot axis is located on the outer side of the secondary cold plate 2, thereby not only increasing the contact area between the second part and the corresponding secondary cold plate 2, making the connection between the second part and the corresponding secondary cold plate 2 more reliable, but also ensuring that the secondary cold plate 2 does not interfere with the OE and other components during the pivoting process.

Figure 6:
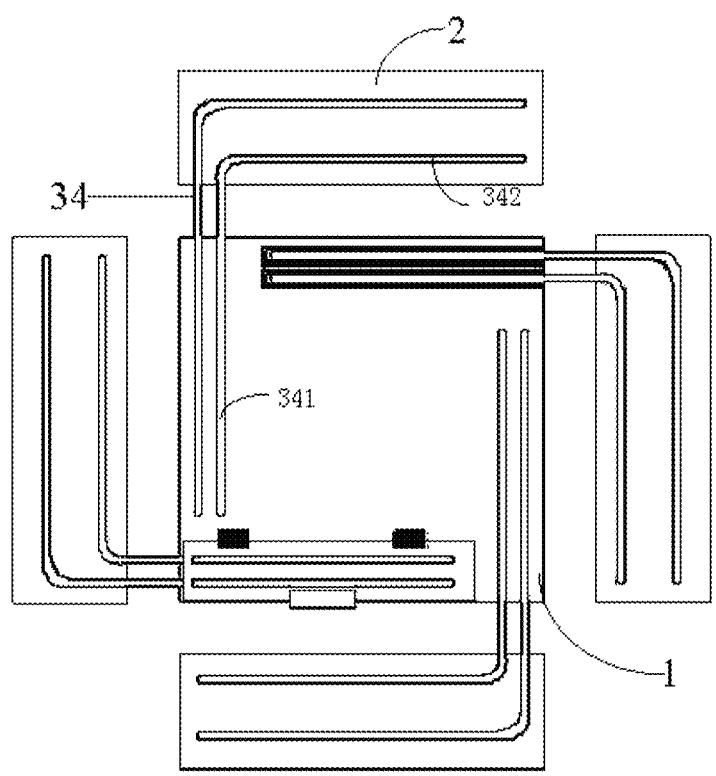
FIG. 6 is a schematic diagram of still another heat dissipation structure for an optoelectronic module provided by an embodiment of this application.

Still considering the electronic chip as a polygonal structure, with a plurality of OEs divided into a plurality of OE groups, different OE groups corresponding to different edges of the electronic chip, each OE group including a plurality of OEs arranged along a length direction of the corresponding edge of the electronic chip, and the secondary cold plates 2 corresponding one-to-one with the OE groups. In an optional implementation, as shown in FIG. 6, the heat pipe assembly 3 includes at least one third heat pipe 34, where the third heat pipe 34 includes a third part 341 detachably connected to the main cold plate 1 and a fourth part 342 connected to the third part and away from the main cold plate 1, the fourth part 342 being fixedly connected (for example, by brazing) to the corresponding secondary cold plate 2.

In this case, when it is necessary to repair or replace one or more OEs in a certain OE group, the connection between the corresponding third heat pipe 34 and the main cold plate 1 is released, and then the connection between the secondary cold plate 2 and the surrounding components is released, thereby being capable of removing the secondary cold plate 2 from the third heat pipe 34, and exposing the corresponding OE.

Specifically, the quantity of third heat pipes 34 may be one, two, or three, and this application does not limit the quantity of third heat pipes 34.

Exemplarily, the third heat pipes 34 are detachably connected to the main cold plate 1, which may be that the main cold plate 1 is provided with insertion holes corresponding one-to-one with the third heat pipes 34, and the condensing end of each third heat pipe 34 is inserted into the corresponding insertion hole.

Optionally, the main cold plate 1 is provided with limiting trenches corresponding one-to-one with the third heat pipes 34, and the condensing end of each third heat pipe 34 is arranged in the corresponding limiting trench and is fixed in the corresponding limiting trench with a cover plate having a fastening instrument (for example, a fastener). Specifically, one cover plate may be arranged for each heat pipe, or one for each heat pipe assembly. When it is necessary to replace an OE, the corresponding fastener is opened, and the cover plate may be removed so that the corresponding OE can be maintained or replaced.

It should be noted that the cover plate may alternatively be hingedly connected to the secondary cold plate 2 with a hinged connector (for example, a hinge), and with the cover plate, fastener, and hinge working together to fix the condensing end in the limiting trench, the corresponding fastener may be loosened when it is necessary to replace the OE, and the cover plate may be pivoted open, thereby removing the condensing tube from the limiting trench. In this embodiment, alternatively, the limiting trench may be arranged on the opposite leaves of the hinge, thereby forming the limiting trench by closing the opposite leaves of the hinge when closing the cover plate.

As shown in FIG. 7, in another optional implementation, the OEs correspond one-to-one with the secondary cold plates 2, and the heat pipe assembly 3 includes at least one fourth heat pipe 35, where the fourth heat pipe 35 includes a fifth part 351 detachably connected to the main cold plate 1 and a sixth part 352 connected to the fifth part and away from the main cold plate 1, the sixth part 352 being fixedly connected (for example, by brazing) to the corresponding secondary cold plate 2.

In this case, when it is necessary to repair or replace one or more OEs in a certain OE group, the connection between the corresponding fourth heat pipe 35 and the main cold plate 1 is released, and then the connection between the secondary cold plate 2 and the surrounding components (for example, the components used to fix the secondary cold plate 2) is released, thereby removing the secondary cold plate 2 and the fourth heat pipe 35, exposing the corresponding OE.

Specifically, the quantity of fourth heat pipes may be one, two, or three, and this application does not limit the quantity of fourth heat pipes 35.

Exemplarily, the fourth heat pipes 35 are detachably connected to the main cold plate 1, which may be that the main cold plate 1 is provided with insertion holes corresponding one-to-one with the fourth heat pipes 35, and the condensing end of each fourth heat pipe 35 is inserted into the corresponding insertion hole.

Optionally, the main cold plate 1 is provided with limiting trenches corresponding one-to-one with the fourth heat pipes 35, and the condensing end of each fourth heat pipe 35 is arranged in the corresponding limiting trench and is fixed in the corresponding limiting trench with a cover plate having a fastening instrument (for example, a fastener). Specifically, one cover plate may be arranged for each heat pipe, or one for each heat pipe assembly. When it is necessary to replace the OE, the corresponding fastener is opened, and the cover plate may be removed (the limiting trench changed to a hinge) so that the corresponding OE can be maintained or replaced.

It should be noted that when the cover plate is fixed in the limiting trench through a combination of a fastener and a hinge, the corresponding fastener may be pivoted open when it is necessary to replace the OE.

In an optional implementation, the main cold plate 1 is provided with first limiting insertion holes corresponding one-to-one with the condensing ends of the heat pipes, the condensing ends of the heat pipes are inserted into the corresponding first limiting insertion holes, and either the inner walls of the first limiting insertion holes or the outer peripheral surfaces of the heat pipes are provided with a first thermally conductive layer 41 so that the main cold plate 1 can dissipate heat for the heat pipes more quickly and effectively. In an embodiment, the first thermally conductive layer 41 is filled between the inner wall of the first limiting insertion hole and the outer peripheral surface of the corresponding heat pipe.

In an optional implementation, the secondary cold plate is provided with second limiting insertion holes corresponding one-to-one with the evaporating ends of the heat pipes in the corresponding heat pipe assembly, the evaporating ends of the heat pipes are inserted into the corresponding second limiting insertion holes, and either the inner walls of the second limiting insertion holes or the outer peripheral surfaces of the heat pipes are provided with a second thermally conductive layer 42. In an embodiment, the second thermally conductive layer 42 is filled between the inner wall of the second limiting insertion hole and the outer peripheral surface of the corresponding heat pipe.

Exemplarily, the material of the thermally conductive layer may be high thermal conductivity carbon fiber or the like, and the thermally conductive layer may be barrel-shaped with one opening end, and arranged to surround the heat pipe.

Figure 8:
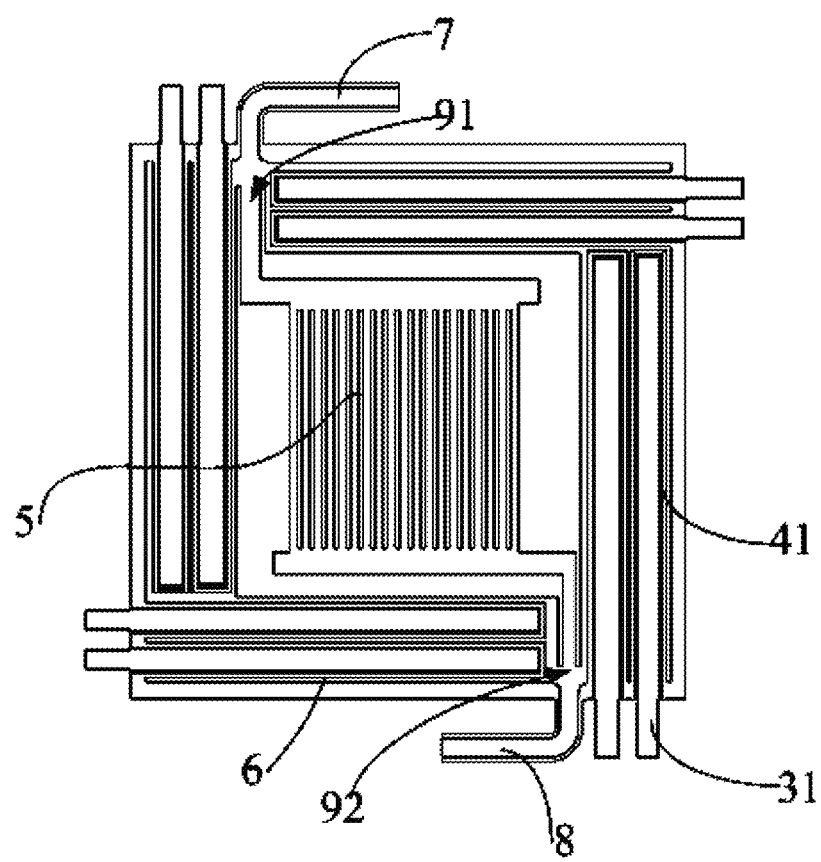
FIG. 8 is a partial structural schematic diagram of the heat dissipation structure for an optoelectronic module shown in FIG. 1.

As shown in FIG. 8, in an optional implementation, the flow channels 6 correspond one-to-one with the heat pipes, and each flow channel 6 is arranged around a periphery of the corresponding heat pipe to achieve heat dissipation for the electronic chip and the heat pipes.

Exemplarily, the main cold plate 1 is provided with a coolant inlet 7 and a coolant outlet 8, and one end of each flow channel communicates with the coolant inlet 7 and another end of the flow channel communicates with the coolant outlet 8.

Further, the coolant inlet 7 may communicate with each flow channel through a liquid distribution structure 91, and the coolant outlet 8 may communicate with each flow channel through a liquid collection structure 92. Continuing to refer to FIG. 8, in an optional implementation, when the coolant flows from the heat-dissipating flow channels of the two heat pipes on the left side to the heat-dissipating flow channels of the two heat pipes below through a bypass flow channel, the bypass flow channel bypasses above the heat pipe limiting insertion holes and does not communicate with the heat pipes. The flowing coolant provides cooling for the ASIC chip and the heat pipes, and the two heat pipes on each side provide cooling for the corresponding four OEs. Obviously, the flow channels may also adopt other cascading designs.

Further, in an optional implementation, the main cold plate 1 is a rectangular cold plate, the heat pipes are all connected to a periphery of the rectangular cold plate, and the rectangular cold plate is provided with a radiator 5 at the central part, to increase the effective area of the heat dissipation structure for an optoelectronic module provided by this embodiment, dissipating heat for the optoelectronic module more efficiently and quickly.

Taking FIG. 8 as an example, to maximize the length of the heat pipes inserted into the main cold plate 1 (that is, the heat exchange area), each heat pipe is arranged near an edge part of the corresponding edge of the main cold plate, that is, the shovel-tooth radiator is arranged in the middle, while the heat pipes are arranged around, where the length of the contact area between the heat pipes and the main cold plate 1 is close to 70% of the length of the edge of the main cold plate 1. If the heat pipes are arranged in the center of the corresponding edge of the main cold plate, the maximum contact length between the heat pipes and the main cold plate does not exceed 50% of the length of the side of the main cold plate. In addition, arranging the limiting insertion holes at the border of the main cold plate helps to reduce the thickness of the main cold plate.

Exemplarily, the above-mentioned radiator 5 may be a shovel-tooth radiator.

An electronic device provided by this embodiment includes the above-mentioned heat dissipation structure for an optoelectronic module. In the heat dissipation structure for an optoelectronic module, the main cold plate 1 dissipates heat for the electronic chip, the evaporating end of the heat pipe takes away the heat from the secondary cold plate 2, and the main cold plate 1 cools the condensing end of the heat pipe, thereby dissipating heat for each OE. The secondary cold plate 2 has a maintenance operation position, and when the secondary cold plate 2 is in the maintenance operation position, there is an operational space between the secondary cold plate 2 and the corresponding OE for maintaining the OE. Consequently, for maintenance tasks on the OEs (such as repairs or replacements), there is no need to remove the entire cold plate system; instead, simply positioning the secondary cold plate 2 in the maintenance operation position suffices, making the replacement and maintenance of the OEs more convenient and quicker compared to traditional technology.

The electronic device mentioned in this embodiment may be a switch, server, or other electronic device with a multi-heat source cold plate cooling system that requires maintenance.

Clearly, persons skilled in the art can make various modifications and variations to this application without departing from the spirit and scope of this application. This application is intended to cover these modifications and variations provided that they fall within the scope of the claims of this application and equivalent technologies thereof.

The invention claimed is:

1. A heat dissipation structure for an optoelectronic module, comprising:
   an electronic chip;
   a plurality of optical engines, distributed along a periphery of the electronic chip; and
   a cold plate, comprising:
      a main cold plate for dissipating heat for the electronic chip;
      a secondary cold plate for dissipating heat for at least one of the plurality of optical engines; and
      a heat pipe assembly corresponding to the secondary cold plate, the heat pipe assembly comprising at least one heat pipe, wherein the at least one heat pipe has an evaporating end connected to the secondary cold plate, and a condensing end connected to the main cold plate;
   wherein the main cold plate is provided with a flow channel for dissipating heat for the heat pipe assembly, and
   the secondary cold plate has a maintenance operation position, wherein when the secondary cold plate is in the maintenance operation position, there is an operational space between the secondary cold plate and the corresponding optical engine for maintaining the corresponding optical engine.

2. The heat dissipation structure according to claim 1, wherein the electronic chip is of a polygonal structure, the at least one heat pipe comprises two first heat pipes spaced apart along a length direction of a corresponding edge of the electronic chip, and the two first heat pipes each comprise an evaporating end rotationally arranged on the corresponding secondary cold plate, a condensing end rotationally arranged on the main cold plate, and a connecting section connecting the evaporating end and the condensing end; and the two first heat pipes together with the main cold plate and the secondary cold plate form a double crank mechanism, wherein a connecting line between the two condensing ends of the two first heat pipes on the main cold plate is a frame of the double crank mechanism, allowing the secondary cold plate to switch from an installation operation position to the maintenance operation position.

3. The heat dissipation structure according to claim 2, wherein the double crank mechanism is an unequal-length double crank mechanism or an equal-length double crank mechanism.

4. The heat dissipation structure according to claim 2, wherein the at least one heat pipe further comprises a virtual constraint heat pipe, the virtual constraint heat pipe comprises an evaporating end arranged on the secondary cold plate, a condensing end arranged on the main cold plate, and a connecting section connecting the evaporating end and the condensing end, and the virtual constraint heat pipe forms a virtual constraint between the main cold plate and the secondary cold plate.

5. The heat dissipation structure according to claim 1, wherein the electronic chip is of a polygonal structure, the at least one heat pipe comprises a second heat pipe arranged at one side of a corresponding edge of the electronic chip, the second heat pipe comprises a first part rotationally arranged on the main cold plate and a second part connected to the first part and away from the main cold plate, and the second part is fixedly connected to the secondary cold plate.

6. The heat dissipation structure according to claim 5, wherein a length direction of the secondary cold plate is parallel to a length direction of the corresponding edge of the electronic chip; and the first part and the second part form an angle with each other, and the first part and the secondary cold plate are sequentially arranged along the length direction of the secondary cold plate.

7. The heat dissipation structure according to claim 1, wherein the electronic chip is of a polygonal structure, the at least one heat pipe comprises at least one third heat pipe arranged at one side of a corresponding edge of the electronic chip, the third heat pipe comprises a third part detachably connected to the main cold plate and a fourth part connected to the third part and away from the main cold plate, and the fourth part is fixedly connected to the secondary cold plate.

8. The heat dissipation structure according to claim 1, wherein the electronic chip is of a polygonal structure, the at least one heat pipe comprises at least one fourth heat pipe arranged at one side of a corresponding edge of the electronic chip, and the fourth heat pipe comprises a fifth part detachably connected to the main cold plate and a sixth part connected to the fifth part and away from the main cold plate, the sixth part being fixedly connected to the corresponding secondary cold plate.

9. The heat dissipation structure according to claim 1, wherein the flow channel is arranged around a periphery of the heat pipe assembly to achieve heat dissipation for the electronic chip and the heat pipe assembly.

10. The heat dissipation structure according to claim 9, wherein the main cold plate is provided with a coolant inlet and a coolant outlet, and one end of the flow channel communicates with the coolant inlet and another end of the flow channel communicates with the coolant outlet.

11. The heat dissipation structure according to claim 9, wherein the at least one heat pipe is arranged on the main cold plate and is located in a peripheral area of the radiator.

12. The heat dissipation structure according to claim 10, wherein the coolant inlet communicates with the flow channel through a liquid distribution structure, and the coolant outlet communicates with the flow channel through a liquid collection structure.

13. The heat dissipation structure according to claim 1, wherein the main cold plate is a rectangular cold plate, the at least one heat pipe is connected to a periphery of the rectangular cold plate, and the rectangular cold plate is provided with a radiator.

14. An electronic device, comprising the heat dissipation structure for an optoelectronic module according to claim 1.

* * * * *